US009003259B2

(12) United States Patent
Cooper

(10) Patent No.: US 9,003,259 B2
(45) Date of Patent: Apr. 7, 2015

(54) INTERLEAVED PARALLEL REDUNDANCY CHECK CALCULATION FOR MEMORY DEVICES

(75) Inventor: John F. Cooper, Mason, NH (US)

(73) Assignee: Red Hat, Inc., Raleigh, NC (US)

( * ) Notice: Subject to any disclaimer, the term of this patent is extended or adjusted under 35 U.S.C. 154(b) by 1466 days.

(21) Appl. No.: 12/324,494

(22) Filed: Nov. 26, 2008

(65) Prior Publication Data

US 2010/0131832 A1 May 27, 2010

(51) Int. Cl.
*H03M 13/00* (2006.01)
*G11C 29/00* (2006.01)
*G06F 11/10* (2006.01)
*G06F 11/07* (2006.01)
*H03M 13/09* (2006.01)
*H03M 13/15* (2006.01)
*H04L 1/00* (2006.01)

(52) U.S. Cl.
CPC ........ *G06F 11/1004* (2013.01); *G06F 11/0763* (2013.01); *H03M 13/09* (2013.01); *H04L 1/004* (2013.01); *H03M 13/15* (2013.01); *H03M 13/091* (2013.01)

(58) Field of Classification Search
CPC ... H03M 13/09; H03M 13/15; G06F 11/0736; H04L 1/004
USPC .................................................. 714/759, 773
See application file for complete search history.

(56) References Cited

U.S. PATENT DOCUMENTS

| | | | | |
|---|---|---|---|---|
| 3,798,597 A * | 3/1974 | Frambs et al. ................. | 714/781 |
| 5,325,372 A * | 6/1994 | Ish-Shalom ................... | 714/757 |
| 5,619,516 A * | 4/1997 | Li et al. ........................ | 714/807 |
| 5,878,057 A * | 3/1999 | Maa .............................. | 714/757 |
| 6,014,767 A * | 1/2000 | Glaise ........................... | 714/776 |
| 6,029,186 A * | 2/2000 | DesJardins et al. ........... | 708/492 |
| 6,128,760 A * | 10/2000 | Poeppleman et al. ........ | 714/757 |
| 6,189,124 B1 * | 2/2001 | Glaise ........................... | 714/758 |
| 6,195,780 B1 * | 2/2001 | Dravida et al. ............... | 714/758 |
| 6,223,320 B1 * | 4/2001 | Dubey et al. .................. | 714/757 |
| 6,560,742 B1 * | 5/2003 | Dubey et al. .................. | 714/757 |
| 6,763,492 B1 * | 7/2004 | Hurt et al. ..................... | 714/752 |
| 6,912,683 B2 * | 6/2005 | Rifaat et al. .................. | 714/774 |

(Continued)

OTHER PUBLICATIONS

Technical Committee SD Association, "SD Specifications Part A2, SD Host Controller Simplified Specification", Version 2.00, Feb. 8, 2007, 144 pages.

(Continued)

*Primary Examiner* — Joseph D Torres

(74) *Attorney, Agent, or Firm* — Lowenstein Sandler LLP

(57) ABSTRACT

In one embodiment, a mechanism for interleaved parallel cyclic redundancy check calculation for memory devices is disclosed. In one embodiment, a method includes generating an index value as part of a cyclic redundancy check (CRC) operation, the index value being a result of a first exclusive-or operation applied to both of input data directly as-is from a data bus and to data in a 64-bit accumulator utilized to store results of the CRC operation. The method also includes indexing an interleaved parallel CRC table with the index value to retrieve a 64-bit polynomial entry from the CRC table, performing a second exclusive-or operation on the retrieved polynomial entry and data in the 64-bit accumulator, storing the results of the second exclusive-or operation in the 64-bit accumulator, and transmitting contents of the 64-bit accumulator directly as-is to the data bus.

20 Claims, 6 Drawing Sheets

(56) References Cited

U.S. PATENT DOCUMENTS

| | | | |
|---|---|---|---|
| 6,934,730 B2* | 8/2005 | Direen et al. | 708/250 |
| 7,266,760 B1* | 9/2007 | Bain | 714/807 |
| 7,320,101 B1* | 1/2008 | Bain | 714/781 |
| 7,363,574 B1* | 4/2008 | Maitland et al. | 714/759 |
| 7,523,378 B2* | 4/2009 | Dammann et al. | 714/758 |
| 7,543,214 B2* | 6/2009 | Ricci | 714/758 |
| 7,577,895 B2* | 8/2009 | Venkataramana et al. | 714/758 |
| 7,613,980 B2* | 11/2009 | Cavanna et al. | 714/759 |
| 7,627,802 B2* | 12/2009 | Pisek et al. | 714/758 |
| 7,752,525 B2* | 7/2010 | Pisek et al. | 714/758 |
| 7,921,334 B2* | 4/2011 | Kubota et al. | 714/42 |
| 2004/0193993 A1* | 9/2004 | Roy et al. | 714/746 |
| 2004/0193994 A1* | 9/2004 | Roy et al. | 714/746 |
| 2004/0250193 A1* | 12/2004 | Cavanna et al. | 714/758 |
| 2005/0114751 A1* | 5/2005 | Ungstad | 714/781 |
| 2006/0168495 A1* | 7/2006 | Dominic et al. | 714/758 |
| 2009/0006921 A1* | 1/2009 | Engberg | 714/752 |

OTHER PUBLICATIONS

SD Group, "SD Specifications Part 1 Physical Layer, Simplified Specification", Version 1.10, Apr. 3, 2006, 114 pages.

SD Group, "SD Specifications Part 1, Physical Layer Simplified Specification", Version 2.00, Sep. 25, 2006, 129 pages.

* cited by examiner

INTERLEAVED PARALLEL REDUNDANCY CHECK CALCULATION FOR MEMORY DEVICES

TECHNICAL FIELD

The embodiments of the invention relate generally to data transfer and, more specifically, relate to a mechanism for interleaved parallel cyclic redundancy check calculation for memory devices.

BACKGROUND

Current means to communicate with a Secure Digital™ (SD) memory card fall into one of two general modes: (1) a lower performance 1-bit SPI protocol or (2) a higher bandwidth 4-bit SD protocol. The former has the advantage of allowing a very simple interface that, depending upon the application, may require no specialized hardware. The latter allows the maximum theoretical bandwidth available from the device, but in typical application scenarios necessitates specialized hardware to support the SD protocol.

The 4-bit SD mode protocol imposes the use of a Cyclic Redundancy Check (CRC) error checking scheme per each data line. This serves primarily to detect transmission errors due to noise and contact bounce induced by the mechanical interconnect between the demountable card and controller. The CRC computation involves four calculations for each block of data passed on the bus. The nature of these calculations views each bus line (there are 4 bus lines) as an independent bit stream.

However, this leads to a conflict with the data mapping approach of a conventional software CRC calculation, which assumes data is represented as a single bit stream packed into bytes or words of memory. The natural in-memory mapping of SD bus data results in an interleaving of the four bus lines as they are read off of the bus. Attempting to map the SD bus data into a conventional CRC calculation therefore requires unpacking each SD bus line's equal order bits from multiple data bytes into a single line-order byte stream.

This unpacking operation is inefficient without the aid of specialized hardware either in the form of a mechanism external to the CPU or in the form of application-specialized processor instructions. Furthermore, in the case of transmitting data on the SD bus, the results of these four calculations have to be reverse-mapped into the SD bus data bit order before they are transmitted onto the SD bus. A conventional CRC generation operation would require excessive processing overhead negating the throughput advantage via the 4-bit bus over bit serial access methods.

Due to the above-described inefficiencies and processing overhead, a software-based approach to access an SD bus memory device in 4-bit wide mode has not been created. One presently-existing alternative is a hardware-based solution to perform the CRC calculation for the 4-bit SD mode. Although performing the required calculation in hardware requires a fairly trivial amount of circuitry, shifting the problem from moving data via a programmatic CPU pushed/pulled model to one where autonomous hardware performs the same introduces substantial system-wide requirements that typically conflict with the goals of cost sensitive applications.

The only presently-existing exclusive software approach operates to communicate to an SD bus memory card in 1-bit SPI mode where software is used to emulate a SPI host controller. Doing so allows use of CRC generation/validation to be disabled in the communication protocol, but introduces the risk of undetected data corruption. More significantly, the 1-bit SPI mode allows only 25% of the theoretical bandwidth possible from 4-bit SD bus mode.

Therefore, a software-based method to access a bus memory device in 4-bit wide mode with the ability to perform an optimized CRC calculation as dictated by the protocol would be beneficial.

BRIEF DESCRIPTION OF THE DRAWINGS

The invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

Figure 1:
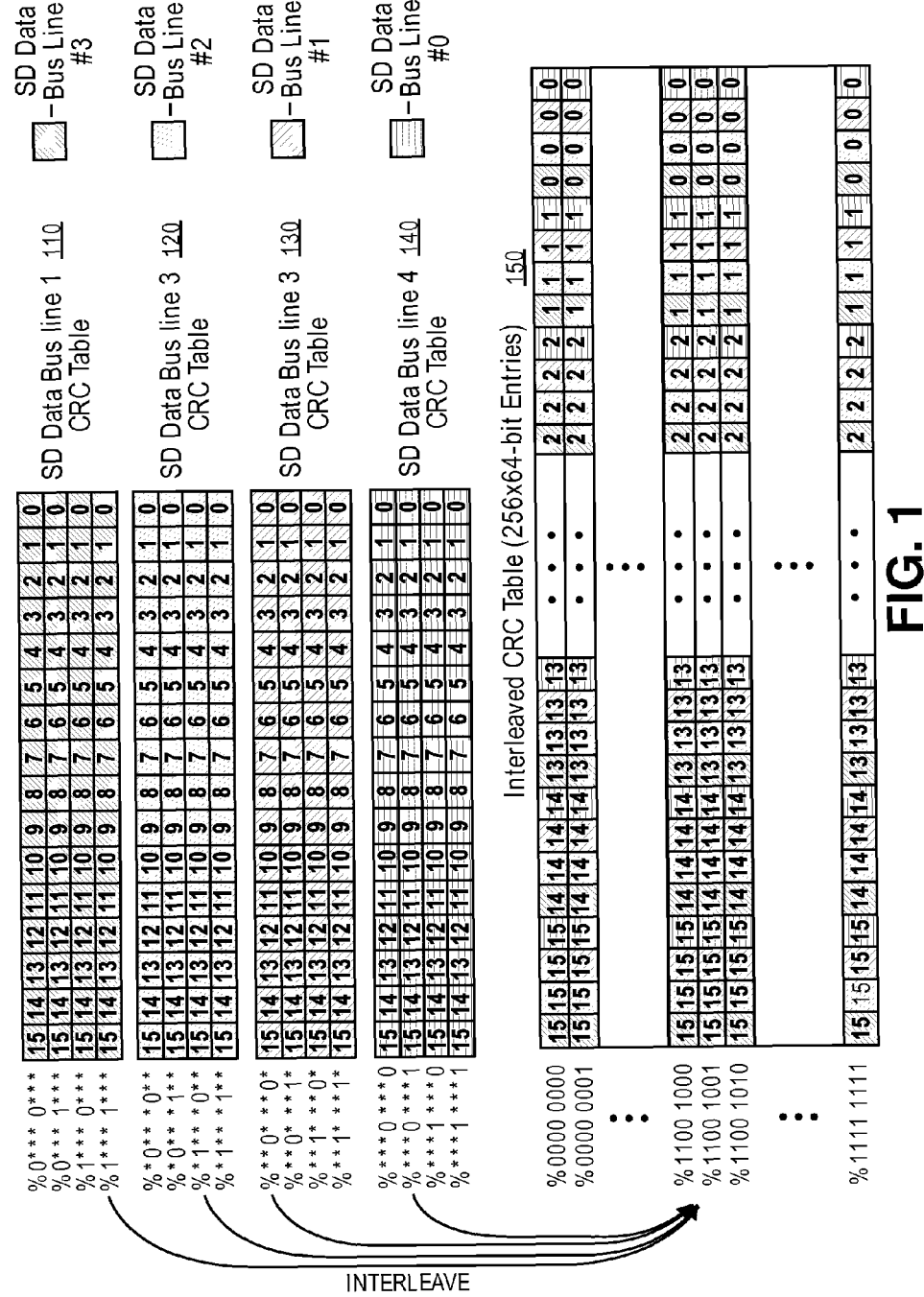
FIG. 1 is a block diagram of the generation of an interleaved parallel CRC table according to embodiments of the invention.

Embodiments of the invention provide for a mechanism for interleaved parallel cyclic redundancy check (CRC) calculation for memory devices. In one embodiment, a method of interleaved parallel CRC calculation for memory cards includes generating an index value as part of a cyclic redundancy check (CRC) operation, the index value being a result of a first exclusive-or operation applied to both of input data directly as-is from a data bus and to data in a 64-bit accumulator utilized to store results of the CRC operation. The method also includes indexing an interleaved parallel CRC table with the index value to retrieve a 64-bit polynomial entry from the CRC table, performing a second exclusive-or operation on the retrieved polynomial entry and data in the 64-bit accumulator, storing the results of the second exclusive-or operation in the 64-bit accumulator, and transmitting contents of the 64-bit accumulator directly as-is to the data bus.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "sending", "receiving", "attaching", "forwarding", "caching", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (non-propagating electrical, optical, or acoustical signals), etc.

Embodiments of the invention provide for interleaved, parallel calculation of multiple CRCs to be generated for payload bus data, while the bus data remains in place in the bus ordering and in the natural data representation of the driving CPU. In one embodiment, the bus data is data from a Secure Digital™ (SD) memory card. For instance, problems presented by conventional methods for 4-bit SD protocol, namely, the disassembly of SD bus data to perform CRC calculations and reassembly to transmit the result on the SD bus, may be avoided if payload data can be used as-is, in its natural in-memory order for the CRC calculations. Although the following description is presented in terms of application to an SD memory card, it is envisioned that embodiments of the invention may also apply to other types of memory devices presenting similar problems with CRC calculations. The description with respect to SD memory cards is not meant to necessarily limit embodiments of the invention to application only this memory type.

As with a conventional CRC calculation scheme, use of a polynomial CRC look-up table may be utilized to accelerate the computation process by allowing the processing of multiple bits per calculation iteration. As defined by the SD specification (SD Specifications Part A2, SD Host Controller Simplified Specification, Version 2.00, Feb. 8, 2007—Technical Committee SD Association; SD Specifications Part 1 PHYSICAL LAYER, Simplified Specification Version 1.10, Apr. 3, 2006—SD Group: Matsushita Electric Industrial CO. Ltd., SanDisk Corporation. Toshiba Corporation, Technical Committee SD Card Association; SD Specifications Part 1 Physical Layer Simplified Specification Version 2.00, Sep. 25, 2006—SD Group Matsushita Electric Industrial Co. Ltd. (Panasonic), SanDisk Corporation, Toshiba Corporation, Technical Committee SD Card Association), a generator polynomial for the payload data CRC calculation is utilized. The generator polynomial is $x^{16}+x^{12}+x^5+1$, or conventionally 0x1021 (most significant bit omitted by convention). However, in order to use the input data as-is and without modification to index the table, CRC table entries should exist such that, per SD bus data line, non-adjacent line bits in the input data stream will address the CRC table to retrieve the correct data, irrespective of the other SD bus line values coexisting in the same input stream. Embodiments of the invention accomplish this goal by replicating CRC table data to allow aliasing of polynomial table values for all possible SD bus data permutations.

FIG. 1 is a block diagram of the generation of an interleaved parallel CRC table utilized by embodiments of the invention. As shown in FIG. 1, a single unified interleaved parallel CRC lookup table 150 is constructed. The single interleaved parallel CRC table 150 should contain all permutations of the CRC polynomial corresponding to all four SD bus data lines. Individual permutations of the CRC polynomial for each SD data bus line are shown as tables 110, 120, 130, and 140. Each base CRC table 110-140 is identified in FIG. 1 with unique shading to correspond to the SD data bus line represented by the base CRC table.

Construction of the single interleaved parallel CRC table 150 is derived from the interleaving of the four base tables 110-140. As illustrated, the interleaved pattern in the single interleaved parallel CRC table 150 is shown by the unique shading from the individual base CRC tables 110-140. The interleaving of the four base CRC tables 110-140 results in 256×64-bit entries in the single interleaved parallel CRC table 150. In one embodiment, the interleaved parallel CRC table 150, as well as the four base CRC tables 110-140, are stored in memory, such as memory 604 described with respect to FIG. 6.

Given the nature of the polynomial algebraic operations used to effect a CRC calculation, individual bits from the four SD data base lines may be operated upon by the CRC calculation independently without consequence to adjacent bits in other SD data bus lines. As such, instead of performing four individual CRC calculations for each SD data bus line that would utilize four 16-bit accumulators per SD bus data line to store the on-going CRC calculation, embodiments of the invention effect a substantial optimization by performing a single CRC calculation on bits from all of the SD bus data lines. In order to perform this single CRC calculation, the four 16-bit accumulators required for each individual SD bus data line CRC calculation are grouped into a single 64-bit accumulator.

Figure 2:
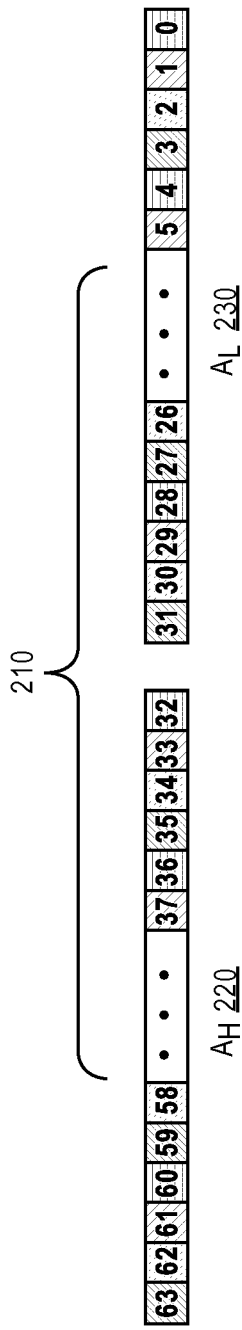
FIG. 2 is a block diagram of a 64-bit accumulator of embodiments of the invention.

In one embodiment, the single 64-bit accumulator is emulated by using two natural-sized registers of a 32-bit CPU architecture. For example, a 64-bit accumulator 210 is shown in FIG. 2 as the compilation of two 32-bit registers, $A_H$ 220 and $A_L$ 230. In one embodiment, the 32-bit registers 220, 230 may reside in a processor, such as processor 602 described with respect to FIG. 6. The 64-bit accumulator 210 of embodiments of the invention functions identically to its previous counterparts by holding intermediate state during the CRC calculation and containing the final result of the CRC calculation. An added benefit of maintaining the natural SD bus data ordering in the 64-bit accumulator 210 is that that CRC calculation result will be similarly interleaved and suitable for direct transmission on the SD bus without subsequent processing.

In one embodiment, the length of the interleaved parallel table is a compromise between number of bits processed per iteration 'nb', the size of the look-up table that tallies as 2^'nb' words, and the per-SD bus line reference 16-bit accumulator's length being an integral multiple of 'nb'. Given these constraints, a value of 8 for 'nb' allows the calculation to consume that many bits per iteration, yields a look-up table of 256 words, and divides evenly into the 64-bit accumulator 210 of FIG. 2. The table entry word size as well is of a 64-bit length corresponding to the length of the accumulator.

Figure 3:
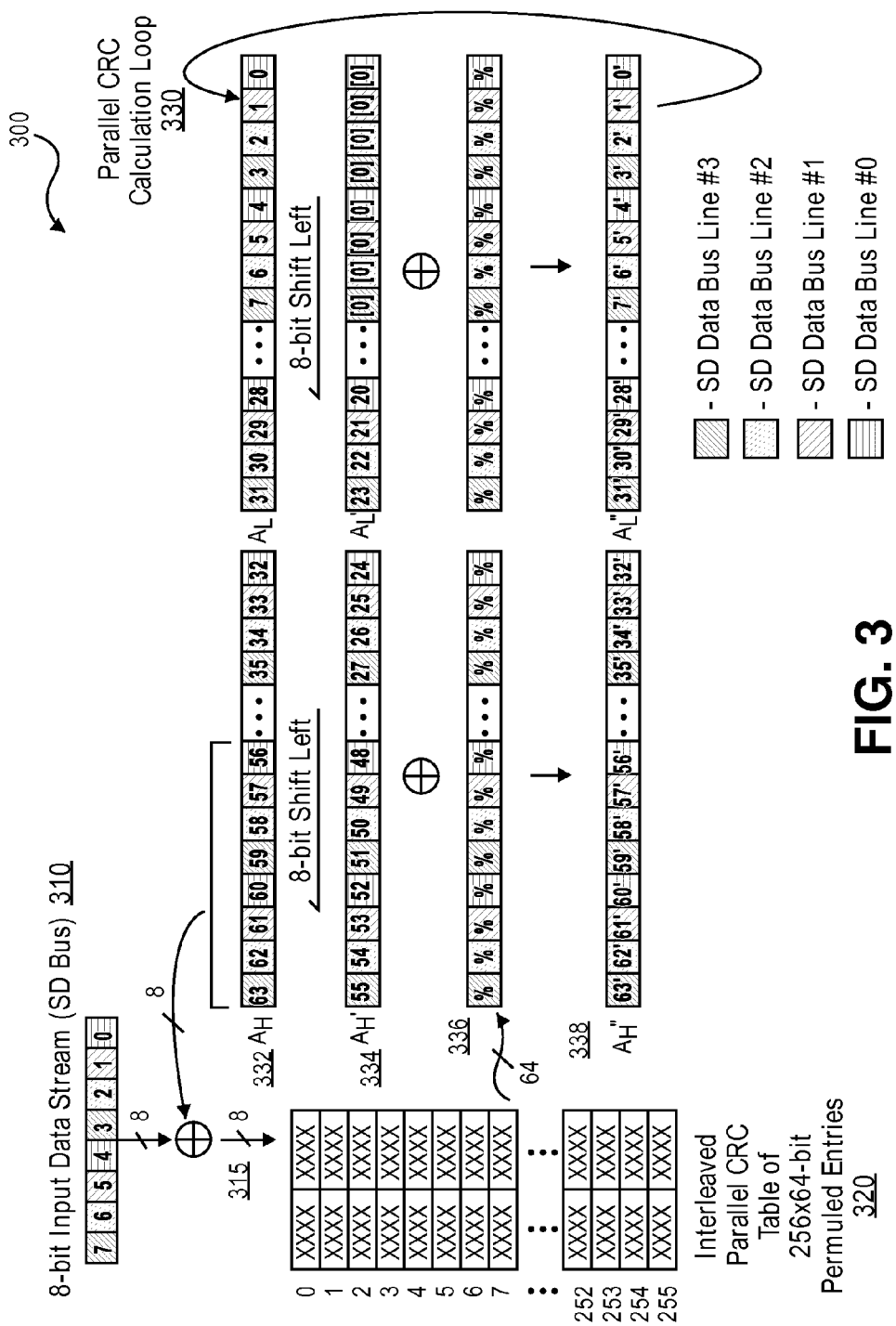
FIG. 3 is a block diagram depicting an interleaved parallel CRC operation module for an SD memory card according to embodiments of the invention.

FIG. 3 is a block diagram depicting an interleaved parallel CRC operation module 300 for an SD memory card according to embodiments of the invention. An interleaved parallel CRC operation 330 performed by module 300 proceeds via processing 8 bits of SD data bus data per input byte 310 (2 SD bus data bits for each of the four bus lines) per CRC iteration 330. The 8 bits of input data 310 are exclusive-or'ed with the first 8 most significant bits 332 of the 64-bit accumulator utilized to store the intermediate and final result of the CRC calculation 330. In one embodiment, this 64-bit accumulator is the same as accumulator 210 depicted in FIG. 2. The 64-bit accumulator is then shifted 8-bits left resulting in a new value in the 64-bit accumulator 334.

The result of the exclusive-or operation is then used as an index 315 into an interleaved parallel CRC table 320 to retrieve a 64-bit polynomial entry 336. The interleaved parallel CRC table 320 is generated in the same manner as interleaved parallel CRC table 150 depicted in FIG. 1. The retrieved 64-bit polynomial entry 336 is then exclusive-or'ed with the current 64-bit accumulator value 334 to produce a new CRC result 338 in the 64-bit accumulator. If any additional input bytes on the SD data bus are to be processed by the parallel CRC calculation 330, then the above process is repeated on those remaining bytes. Upon exhaustion of the input data 310, the 64-bit accumulator will contain the four interleaved CRC results 338 from the SD bus data lines, in SD bus bit order, and may be directly transmitted onto the SD bus. It is envisioned that interleaved parallel CRC operation module 300 may be implemented solely in software, solely in hardware, or in a combination of software and hardware.

Figure 4:
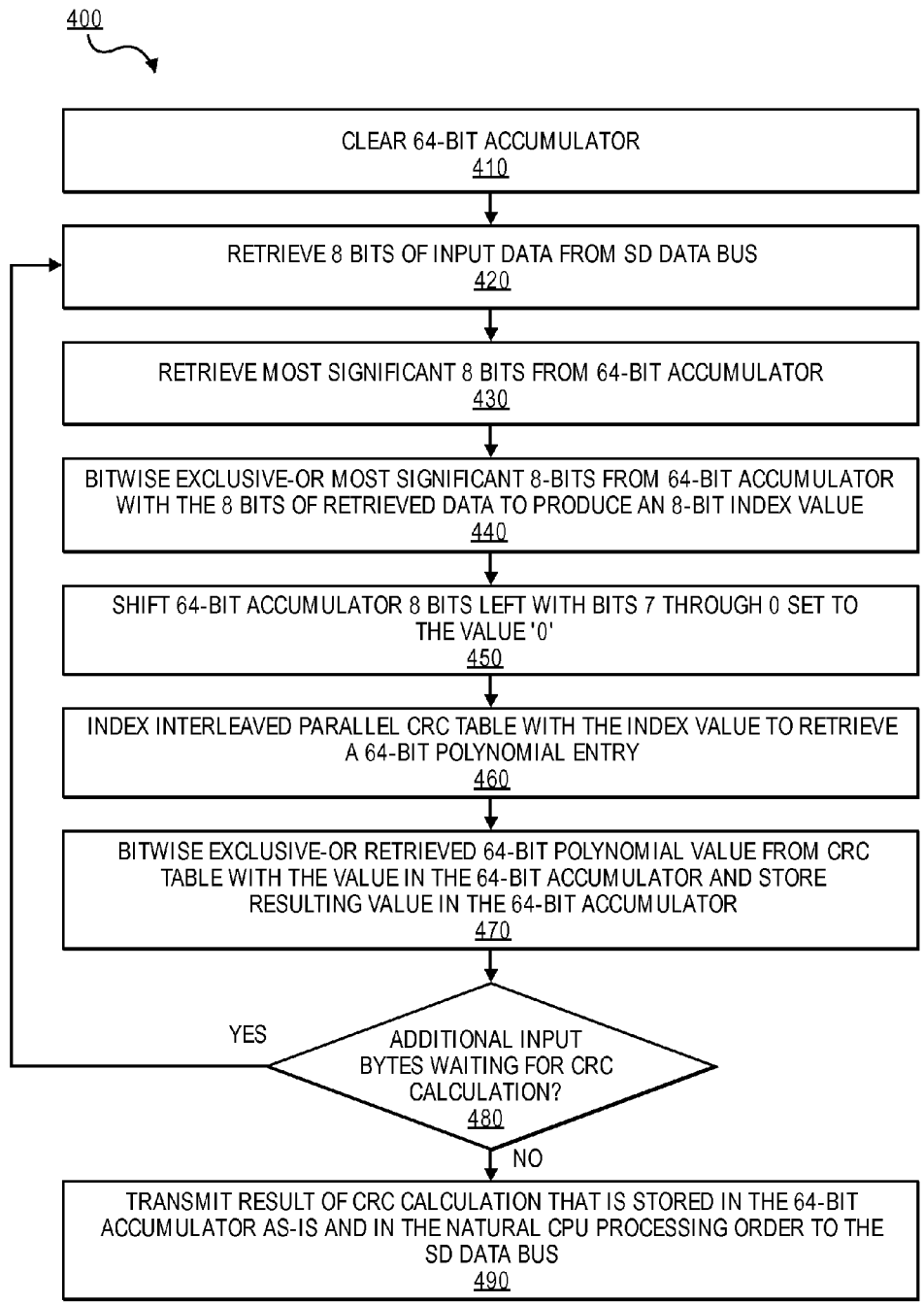
FIG. 4 is a flow diagram illustrating a method for interleaved parallel CRC operation for an SD memory card according to an embodiment of the invention.

FIG. 4 is a flow diagram illustrating a method 400 for an interleaved parallel CRC operation for an SD memory card according to an embodiment of the invention. Method 400 may be performed by processing logic that may comprise hardware (e.g., circuitry, dedicated logic, programmable logic, microcode, etc.), software (such as instructions run on a processing device), or a combination thereof. In one embodiment, method 400 is performed by interleaved parallel CRC operation module 300 of FIG. 3.

Method 400 begins at block 410 where a 64-bit accumulator is cleared. Then, at process block 420, 8 bits of input data from an SD data bus are retrieved. At process block 430, the most significant 8-bits of data (bits 63 through 56) are retrieved from the 64-bit accumulator. The 8 bits of input data are then bitwise exclusive-or'ed with the most significant 8-bits of data from the accumulator resulting in an 8-bit index value at process block 440.

At process block 450, the 64-bit accumulator is shifted 8 bits left with bits 7 through 0 being set to a '0' value. Then, at process block 460, an interleaved parallel CRC table, such as the ones (150 and 320) described with respect to FIGS. 1 and 3, is indexed via the index value generated in process block 440 to retrieve a 64-bit polynomial entry. The 64-bit polynomial entry from the interleaved parallel CRC table is then bitwise exclusive-or'ed with the current value in the 64-bit accumulator and the resulting value is stored in the 64-bit accumulator at process block 470.

At decision block 480 it is determined whether there are any additional input bytes from the SD data bus to be processed by the CRC operation. If so, method 400 returns to process block 420 where the CRC operation is repeated for the additional remaining input bytes. If not, method 400 continues to process block 490 where the 64-bit accumulator contains the result of the interleaved parallel CRC computation to be transmitted on the SD data bus.

Figure 5:
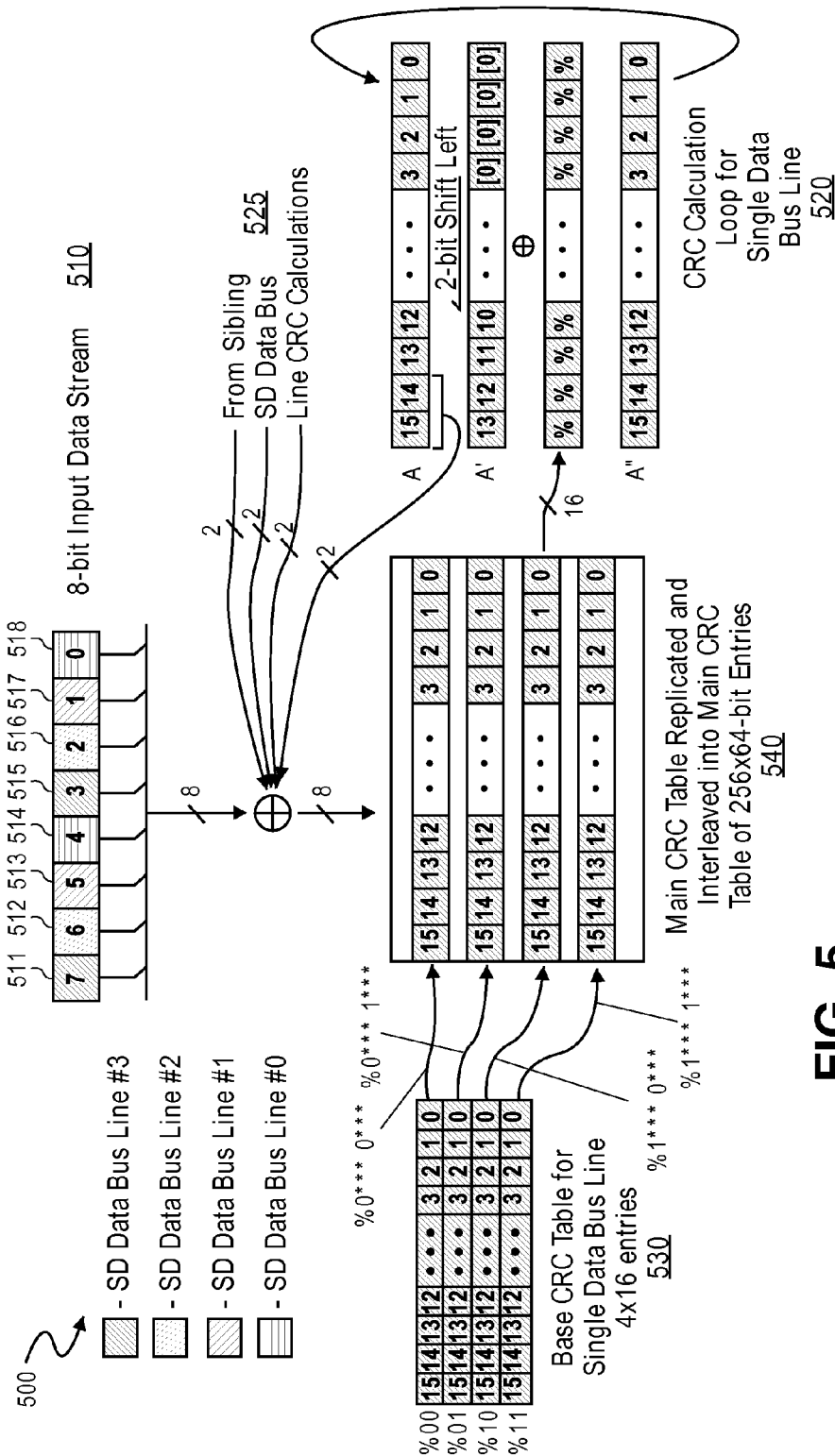
FIG. 5 is a block diagram illustrating an elemental CRC operation module conceptually operating on a single SD data bus line according to an embodiment of the invention.

FIG. 5 is a block diagram illustrating an elemental CRC operation module 500 conceptually operating on a single SD data bus line according to an embodiment of the invention. In FIG. 5, the CRC operation depicted in FIGS. 3 and 4 and correspondingly described above is shown operating in a more detailed and conceptual level on an individual SD data bus line. It is envisioned that elemental CRC operation module 500 may be implemented solely in software, solely in hardware, or in a combination of software and hardware. As shown, the elemental CRC operation module 500 depicts the interleaved parallel CRC operation of embodiments of the invention as applied to SD bus data line #3.

Exclusive-or'ed data bits from SD data bus line #3 index an interleaved parallel CRC table 540 via input byte values 510 of (IN7 511, IN3 515) or %0*0*, %0*1*, %1*0*, and %1*1*. Initially, a base CRC table 530 for the individual SD bus data line is constructed per typical CRC procedures (e.g., polynomial generator) and then the resulting 4×16 bit table 530 is mapped into a target 64-bit interleaved parallel CRC table 540, along with the other 4×16 bit base CRC tables corresponding to the other SD data bus lines, to agree with in-memory, SD bus bit-mapping. Thus, to create entry aliases corresponding to each of the four line permutations possible in (IN7 511, IN3 515), the same value is replicated in the main CRC table 540 in all 64 entries in the series: % (IN7)000(IN3)000 to % (IN7)111(IN3)111.

The CRC calculation loop 520 for SD data bus line #3 is shown on a conceptual level in FIG. 5, with the CRC operations described with respect to FIGS. 3 and 4 being performed. Similar operations would be performed for the remaining SD bus data line bit pairs of [IN6 (512), IN2 (516)], [IN5 (513), IN1 (517)], and [IN4 (514), IN0 (518)], shown by 525. If these bit pairs were treating separately, as conventional methods have done, an overhead of four calculations would be incurred and the calculations would result in 4 disjoint 16-bit accumulators that must be interleaved into SD bus ordering before transmission onto the SD data bus. Embodiments of the invention avoid this overhead by treating the input bytes as-is and in their in place ordering, utilizing an interleaved parallel CRC table, and storing results in a 64-bit accumulator.

Embodiments of the invention provide an advantage in the case where custom hardware is not available to support SD CRC. The above described embodiments of the invention deal with this problem by providing a software implementation to support SD CRC in a cost-effective and time-sensitive manner. However, one skilled in the art will appreciate that other hybrid software/hardware implementations of embodiments of the invention are envisioned and not foreclosed by the above description.

Figure 6:
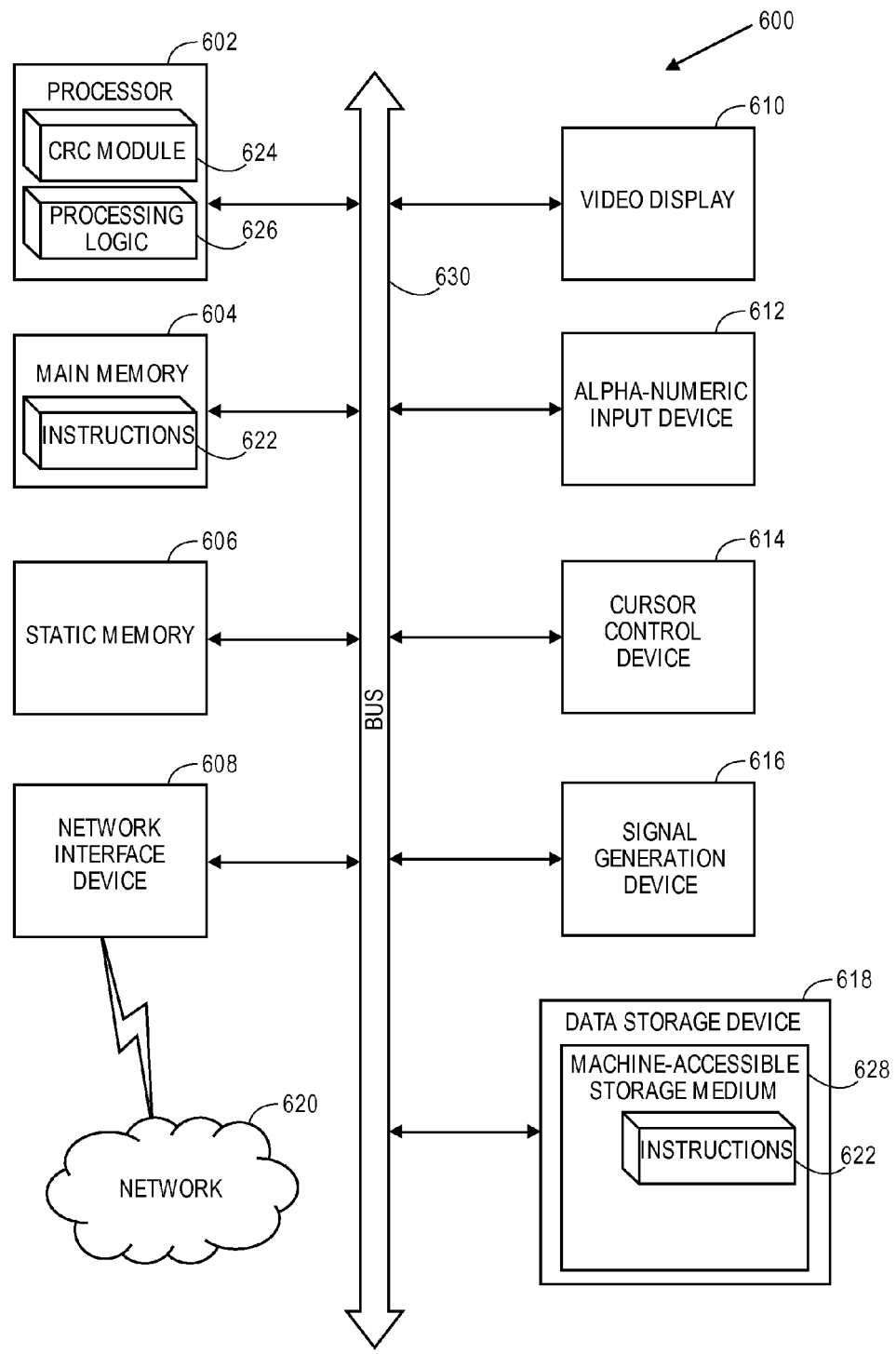
FIG. 6 is a block diagram illustrating a computer system of embodiments of the invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a LAN, an internet, an extranet, or the Internet. The machine may operate in the capacity of a server or a client machine in a client-server network environment, or as a peer machine in a peer-to-peer (or distributed) network environment. In one embodiment, the machine may include only a subset of its illustrated components.

The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 600 includes a processing device 602, a main memory 604 (e.g., read-only memory (ROM), flash memory, dynamic random access memory (DRAM) (such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

Processing device 602 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 is configured to execute the processing logic 626 for performing the operations and steps discussed herein. In some embodiments, processor 602 may also include a CRC Module 624 to perform the CRC operation of parallel CRC operation module 300 or parallel CRC operation module 500 described with respect to FIGS. 3 and 5.

The computer system 600 may further include a network interface device 608. The computer system 600 also may include an visual output device 610 (e.g., a liquid crystal display (LCD) or a cathode ray tube (CRT)), an input device 612 (e.g., a keyboard), a cursor control device 614 (e.g., a mouse), and an audio output device 616 (e.g., a speaker).

The data storage device 618 may include a machine-accessible storage medium 628 on which is stored one or more set of instructions (e.g., software 622) embodying any one or more of the methodologies of functions described herein. The software 622 may also reside, completely or at least partially, within the main memory 604 and/or within the processing device 602 during execution thereof by the computer system 600; the main memory 604 and the processing device 602 also constituting machine-accessible storage media. The software 622 may further be transmitted or received over a network 620 via the network interface device 608.

The machine-readable storage medium 628 may also be used to stored instructions to perform the CRC operation of CRC operation module 300 or 500 described with respect to FIGS. 3 and 5, and/or a software library containing methods that call the above applications. While the machine-accessible storage medium 628 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the present invention. The term "machine-accessible storage medium" shall accordingly be taken to include, but not be limited to, solid-state memories, and optical and magnetic media.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A method, comprising:
generating, by a processing device of a computing system, an index value as part of a cyclic redundancy check (CRC) operation, the index value comprising a result of a first exclusive-or function applied to both of input data transmitted on a data bus and data in an accumulator of the processing device that is utilized to store results of the CRC operation;
indexing, by the processing device, an interleaved parallel CRC table with the index value to retrieve a polynomial entry from the interleaved parallel CRC table, wherein the interleaved parallel CRC table is generated by interleaving a plurality of base CRC tables each generated for each line of the data bus;
performing, by the processing device, a second single exclusive-or function on an entirety of the retrieved polynomial entry and an entirety of the data in the accumulator;
storing, by the processing device, the results of the second exclusive-or operation in the accumulator;
repeating the generating, the indexing, the performing, and the storing on any remaining input data transmitted on the data bus that is waiting for the CRC operation to be applied, the repeating to occur while the input data remains in place in an in-memory order of the data bus and in an unmodified data representation of the processing device; and transmitting, by the processing device, contents of the accumulator to the data bus.

2. The method of claim 1, wherein the CRC table is the result of interleaving four 4×16-bit CRC tables that are generated for each line of the data bus.

3. The method of claim 1, wherein the accumulator is shifted 8 bits left after the process of generating the index value.

4. The method of claim 1, wherein the accumulator is a 64-bit accumulator that is the compilation of two 32-bit registers.

5. The method of claim 1, wherein the first exclusive-or function utilizes the first eight most significant bits from the accumulator as the data from the accumulator.

6. The method of claim 1, wherein the second exclusive-or function utilizes the entire contents of the accumulator as the data in the accumulator.

7. The method of claim 1, wherein the data bus services a memory card storing the input data that stores the input data.

8. A system, comprising:
a memory;
a processing device communicably coupled to the memory;
a data bus communicably coupling the memory and the processing device, the data bus to transfer input data to be processed by a cyclic redundancy check (CRC) operation;
an accumulator in the processing device, the accumulator to store results of the CRC operation; and
a CRC module in the processing device and communicably coupled to the data bus and the accumulator, the CRC module to:
generate an index value as part of the CRC operation, the index value comprising a result of a first exclusive-or function applied to both of input data transmitted on the data bus and data in the accumulator;
index an interleaved parallel CRC table with the index value to retrieve a polynomial entry from the CRC table;
index an interleaved parallel CRC table with the index value to retrieve a polynomial entry from the interleaved parallel CRC table, wherein the interleaved parallel CRC table is generated by interleaving a plurality of base CRC tables each generated for each line of the data bus;
perform a second single exclusive-or function on an entirety of the retrieved polynomial entry and an entirety of the data in the accumulator;
store the results of the second exclusive-or operation in the accumulator;
repeat the generating, the indexing, the performing, and the storing on any remaining input data transmitted on the data bus that is waiting for the CRC operation to be applied, the repeating to occur while the input data remains in place in an in-memory order of the data bus and in an unmodified data representation of the processing device; and
transmit contents of the accumulator to the data bus.

9. The system of claim 8, wherein the CRC table is the result of interleaving four 4×16-bit CRC tables that are generated for each line of the data bus.

10. The system of claim 8, wherein the first exclusive-or function utilizes the first eight most significant bits from the accumulator as the data from the accumulator.

11. The system of claim 8, wherein the second exclusive-or function utilizes the entire contents of the accumulator as the data in the accumulator.

12. The system of claim 8, wherein the data bus services a memory card storing the input data that stores the input data.

13. The system of claim 8, wherein the accumulator is shifted 8 bits left after the process of generating the index value.

14. The system of claim 8, wherein the accumulator is a 64-bit accumulator that is the compilation of two 32-bit registers.

15. A non-transitory machine-readable storage medium including instructions that, when accessed by a processing device, cause the processing device to perform operations comprising:
generating, by the processing device of a computing system, an index value as part of a cyclic redundancy check (CRC) operation, the index value comprising a result of a first exclusive-or function applied to both of input data transmitted on a data bus and data in an accumulator of the processing device that is utilized to store results of the CRC operation;
indexing, by the processing device, an interleaved parallel CRC table with the index value to retrieve a polynomial entry from the interleaved parallel CRC table, wherein the interleaved parallel CRC table is generated by interleaving a plurality of base CRC tables each generated for each line of the data bus;
performing, by the processing device, a second single exclusive-or function on an entirety of the retrieved polynomial entry and an entirety of the data in the accumulator;
storing, by the processing device, the results of the second exclusive-or operation in the accumulator;
repeating the generating, the indexing, the performing, and the storing on any remaining input data transmitted on the data bus that is waiting for the CRC operation to be applied, the repeating to occur while the input data remains in place in an in-memory order of the data bus and in an unmodified data representation of the processing device; and
transmitting, by the processing device, contents of the accumulator to the data bus.

16. The non-transitory machine-readable storage medium of claim 15, wherein the CRC table is the result of interleaving four 4×16-bit CRC tables that are generated for each line of the data bus.

17. The non-transitory machine-readable storage medium of claim 15, wherein the accumulator is shifted 8 bits left after generating the index value.

18. The non-transitory machine-readable storage medium of claim 15, wherein the first exclusive-or function utilizes the first eight most significant bits from the accumulator as the data from the accumulator, and wherein the second exclusive-or function utilizes the entire contents of the accumulator as the data in the accumulator.

19. The non-transitory machine-readable storage medium of claim 15, wherein the data bus services a memory card that stores the input data.

20. The non-transitory machine-readable storage medium of claim 15, wherein the accumulator is a 64-bit accumulator that is the compilation of two 32-bit registers.

* * * * *